US012809267B2

(12) United States Patent
Yun et al.

(10) Patent No.: US 12,809,267 B2
(45) Date of Patent: Nov. 24, 2026

(54) ECO-FRIENDLY PHOTORESIST STRIPPER COMPOSITION

(71) Applicant: SAMYOUNG PURE CHEMICALS CO., LTD., Cheonan-si (KR)

(72) Inventors: Sang Moon Yun, Cheongju-si (KR); Chi Sung Ihn, Cheongju-si (KR); Jung Ig Jeon, Cheonan-si (KR); Hyuck Jae Lee, Yongin-si (KR)

(73) Assignee: SAMYOUNG PURE CHEMICALS CO., LTD., Cheonan-si (KR)

( * ) Notice: Subject to any disclaimer, the term of this patent is extended or adjusted under 35 U.S.C. 154(b) by 248 days.

(21) Appl. No.: 18/709,865

(22) PCT Filed: Nov. 4, 2022

(86) PCT No.: PCT/KR2022/017208

§ 371 (c)(1),
(2) Date: May 23, 2024

(87) PCT Pub. No.: WO2023/090714

PCT Pub. Date: May 25, 2023

(65) Prior Publication Data

US 2025/0053093 A1 Feb. 13, 2025

(30) Foreign Application Priority Data

Nov. 17, 2021 (KR) ........................ 10-2021-0158531

(51) Int. Cl.
*G03F 7/00* (2006.01)
*G03F 7/42* (2006.01)

(52) U.S. Cl.
CPC .............. *G03F 7/425* (2013.01); *G03F 7/426* (2013.01)

(58) Field of Classification Search
CPC ............. G03F 7/425; G03F 7/426; G03F 7/42
USPC .......................................................... 510/176
See application file for complete search history.

(56) References Cited

U.S. PATENT DOCUMENTS

| | | | | |
|---|---|---|---|---|
| 2014/0155310 | A1* | 6/2014 | Phenis | C11D 7/3218 510/176 |
| 2019/0196337 | A1* | 6/2019 | Peters | C11D 1/004 |
| 2020/0339919 | A1* | 10/2020 | Mizutani | C11D 3/28 |

FOREIGN PATENT DOCUMENTS

| | | | | | |
|---|---|---|---|---|---|
| CN | 102221791 | A | * | 10/2011 | G03F 7/42 |
| KR | 20080051250 | A | * | 6/2008 | H10P 30/20 |
| KR | 101366957 | | | 2/2014 | |
| KR | 2017100974 | A1 | * | 9/2017 | C11D 1/40 |
| KR | 20170100974 | | | 9/2017 | |
| KR | 20190106755 | | | 9/2019 | |
| KR | 20190110171 | | | 9/2019 | |
| TW | 201715036 | A | * | 5/2017 | C11D 7/3218 |
| WO | WO 2007046655 | A1 | * | 4/2007 | G03F 7/42 |

* cited by examiner

*Primary Examiner* — Eisa B Elhilo
(74) *Attorney, Agent, or Firm* — LEX IP MEISTER, PLLC

(57) ABSTRACT

The present invention relates to an eco-friendly photoresist stripper composition and, more specifically, to an eco-friendly photoresist stripper composition including 20-50 wt % of a glycol ether, 1-10 wt % of a cyclic alcohol, 1-10 wt % of an inhibitor for preventing the corrosion of aluminum and copper, 0.5-10 wt % of an alkanolamine, 0.01-10 wt % of a reducing sulfur compound and the balance of water, thereby generating no toxic formaldehyde.

7 Claims, 5 Drawing Sheets

[FIG. 1a]
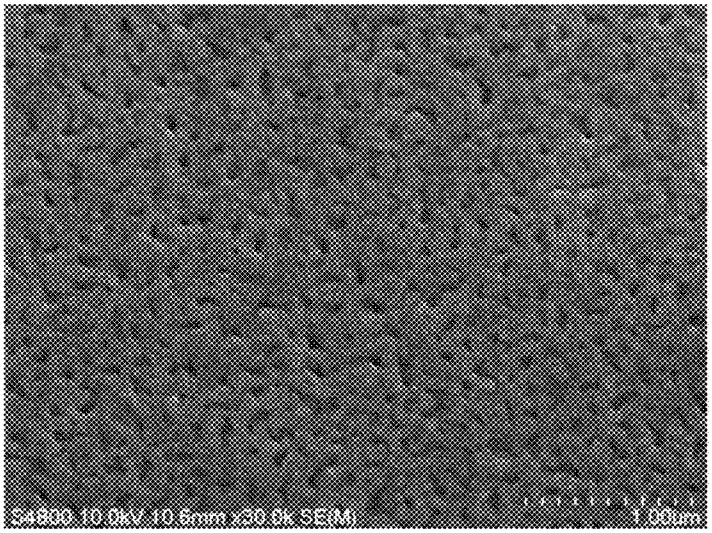
[FIG. 1b]
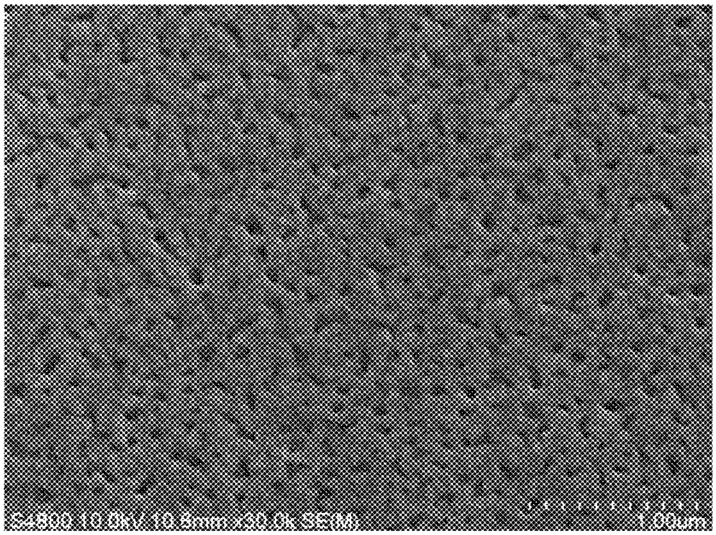

[FIG. 2a]
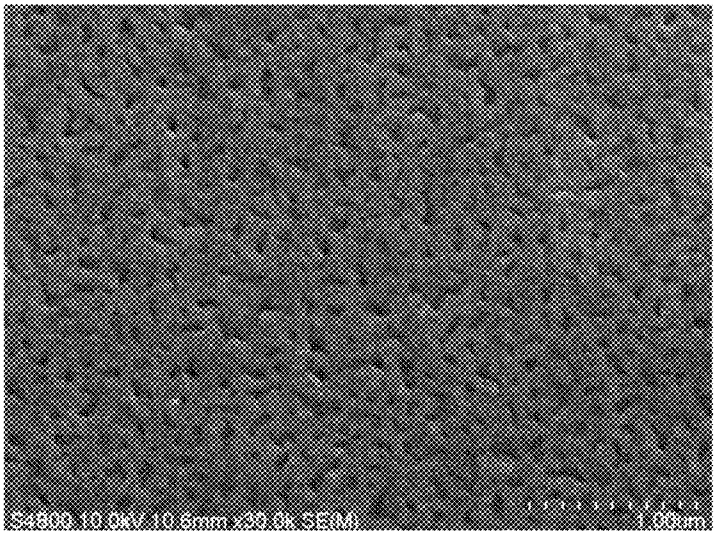
[FIG. 2b]
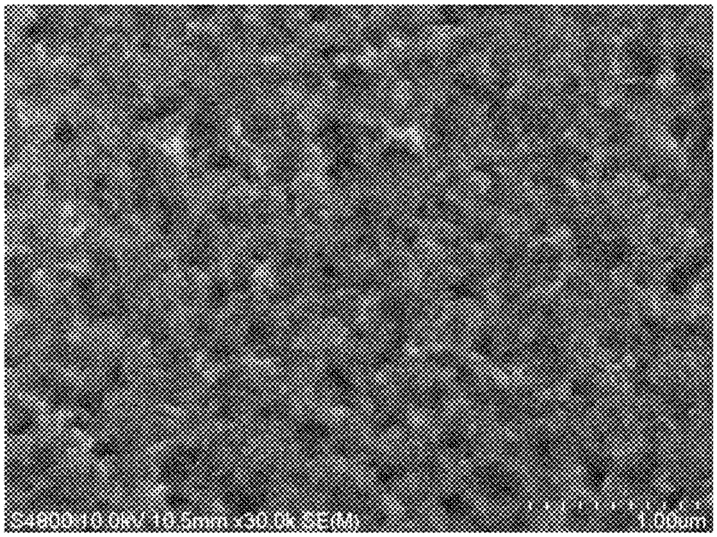

[FIG. 3a]
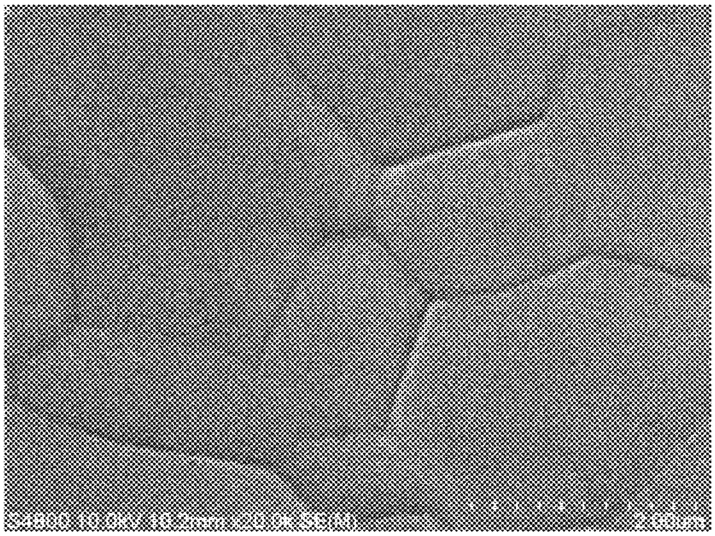
[FIG. 3b]
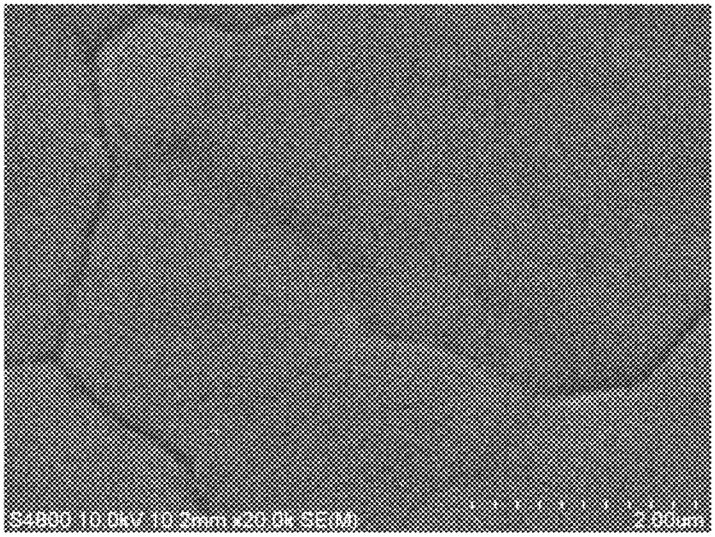

[FIG. 4a]
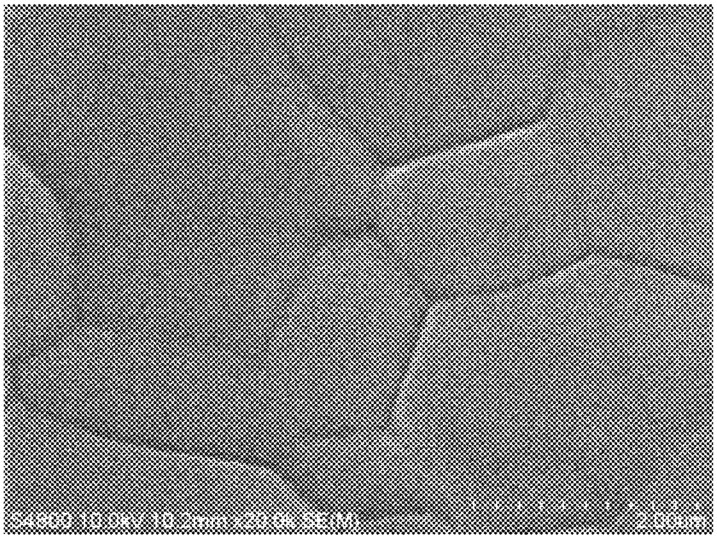
[FIG. 4b]
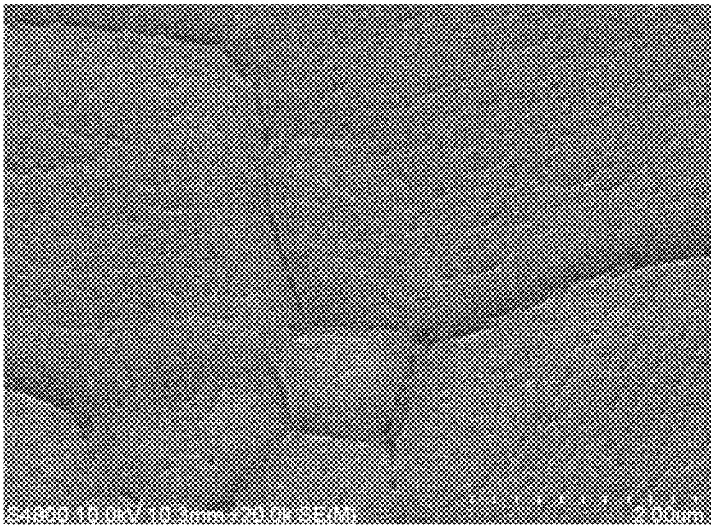

[FIG. 5]
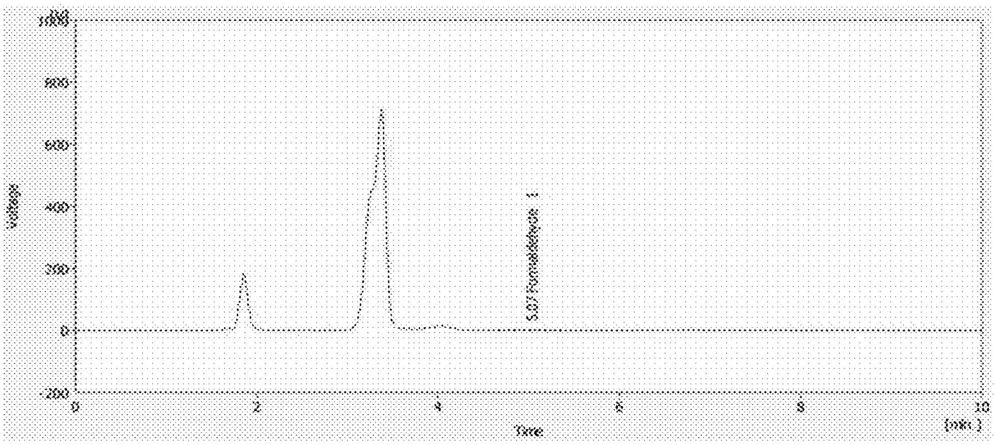
[FIG. 6]
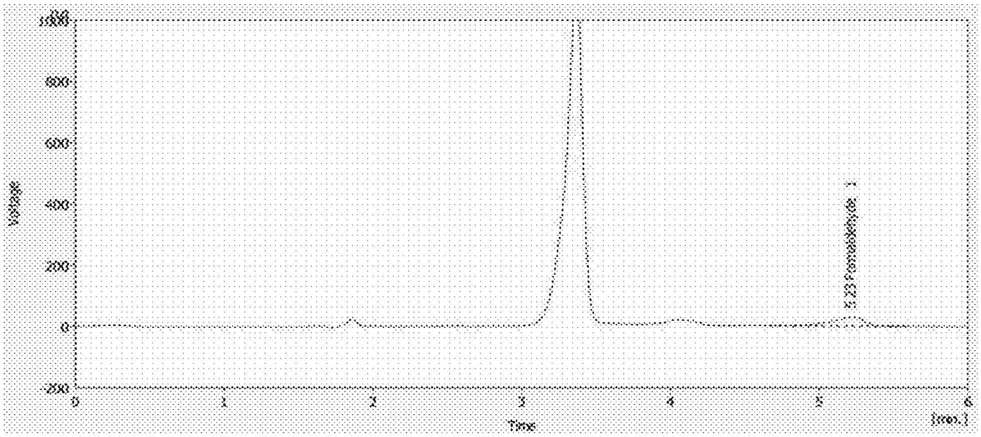

ECO-FRIENDLY PHOTORESIST STRIPPER COMPOSITION

TECHNICAL FIELD

The present invention relates to an eco-friendly photoresist stripper composition, and more particularly, to an eco-friendly photoresist stripper composition which does not generate toxic formaldehyde by including 20 to 50 wt % of a glycol ether, 1 to 10 wt % of a cyclic alcohol, 1 to 10 wt % of an inhibitor preventing corrosion of aluminum and copper, 0.5 to 10 wt % of an alkanolamine, 0.01 to 10 wt % of a reducing sulfur compound, and the balance as water.

BACKGROUND ART

In the lithography process manufacturing integrated circuits of semiconductor devices or microcircuits of flat panel display devices, a photoresist is applied on a substrate coated with a conductive metal film or an insulating film, and the photoresist is selectively exposed and developed to form a microcircuit composed of aluminum or copper metal. At this time, a photoresist stripper is used to remove unnecessary photoresist.

Photoresist stripper compositions generally contain a condensate to which ethylene oxide or propylene oxide is added, and as unreacted ethylene oxide and propylene oxide are oxidized, a large amount of formaldehyde is generated. Formaldehyde is a toxic compound that irritates the nose and eyes of the human body and has recently been pointed out as a carcinogen. Moreover, since most lithography processes are carried out in enclosed areas, formaldehyde generated from photoresist stripper compositions can pose a serious hazard to workers.

In order to improve the working environment for the lithography process, the development of eco-friendly photoresist strippers to reduce the generation of formaldehyde is underway. For example, Publication Patent No. 10-2015-0028526 (Mar. 16, 2015) discloses a resist stripper composition including a formaldehyde scavenger and a water-soluble polar organic solvent.

As the formaldehyde scavenger, one or more selected from 3-aminopentane-1,5-diol, 3-amino-3-methylpentane-1,5-diol, 3-amino-3-ethylpentane-1,5-diol, 3-aminopentane-1,3,5-triol, 3-amino-3-hydroxymethylpentane-1,5-diol, and 4-aminoheptane-2,6-diol may be used. However, this stripper composition has a problem in that it can be decomposed into formaldehyde and a scavenger again depending on the surrounding environment because it is very sensitive to an increase or decrease in pH as an imination reaction.

Publication Patent No. 10-2016-0122328 (Oct. 24, 2016) discloses a method of recovering a second glycol-based compound with a formaldehyde content of 0 ppm by stirring a mixture of a first glycol-based compound containing formaldehyde, a hydrazide-based compound, and a sulfonic acid-based compound and performing fractional distillation of the stirred mixture.

The hydrazide-based compound is a dehydration condensation product of the amino group of hydrazine and the carboxyl group of carboxylic acid, and acts as a formaldehyde scavenger through the reaction with formaldehyde and purification, and the glycol-based compound prepared by this method can be used as a raw material for photoresist strippers. However, this method requires complicated distillation equipment because it has to go through a distillation process, and there is a problem in that the final yield of the stripper composition is reduced because a large amount of the target substance is lost during the distillation process.

DISCLOSURE

Technical Problem

Due to its very low boiling point (20.8° C.), formaldehyde is present in a gaseous state at room temperature, but it is present in a dissolved state in glycol-type organic solvents. Unlike other organic solvents, formaldehyde is continuously produced in glycol-based organic solvents through specific reactions, and thus, formaldehyde cannot be completely removed using conventional distillation methods.

Therefore, the purpose of the present invention is to provide a new eco-friendly photoresist stripper composition which has excellent photoresist removal ability, hardly causes damage to metal circuits composed of aluminum or copper, and does not generate toxic formaldehyde.

Technical Solution

An eco-friendly photoresist stripper composition according to the present invention includes 20 to 50 wt % of a glycol ether, 1 to 10 wt % of a cyclic alcohol, 1 to 10 wt % of an inhibitor preventing corrosion of aluminum and copper, 0.5 to 10 wt % of an alkanolamine, 0.01 to 10 wt % of a reducing sulfur compound, and the balance as water.

The inhibitor is composed of 100 parts by weight of a polyhydric alcohol as a first inhibitor preventing corrosion of aluminum and 0.1 to 10 parts by weight of a nitrogen-containing heterocyclic compound as a second inhibitor preventing corrosion of copper.

The reducing sulfur compound is any one or more selected from lithium bisulfate, sodium bisulfate, potassium bisulfate, ammonium bisulfate, lithium bisulfite, sodium bisulfite, potassium bisulfite, ammonium bisulfite, sulfurous acid, lithium sulfite, sodium sulfite, potassium sulfite, ammonium sulfite, and sulfamic acid.

An eco-friendly photoresist stripper composition according to a preferred embodiment of the present invention includes 30 wt % of diethylene glycol monobutyl ether, 4 wt % of benzyl alcohol, 3 wt % of xylitol, 0.2 wt % of pyrazole, 1 wt % of monoisopropyl alcoholamine, 0.9 wt % of sulfamic acid; and the balance as water.

Advantageous Effects

The photoresist stripper composition according to the present invention has an excellent ability to remove photoresist in the lithography process and hardly causes damage to metal circuits composed of aluminum or copper, and in particular, since the reducing compound reacts with formaldehyde and produces an irreversible salt compound, it does not generate toxic formaldehyde, and thus it is possible to provide very safe working conditions for workers.

DESCRIPTION OF DRAWINGS

FIGS. 1A and 1B are scanning electron microscopy (FE-SEM) images of surface changes of the copper (Cu) circuit in a sample using the stripper composition prepared according to Example 7 of the present invention.

FIGS. 2A and 2B are scanning electron micrographs of surface changes of the copper (Cu) circuit in a sample using the stripper composition prepared according to Comparative Example 2 of the present invention.

FIGS. 3A and 3B are scanning electron micrographs of surface changes of the aluminum (Al) circuit in a sample using the stripper composition prepared according to Example 7 of the present invention.

FIGS. 4A and 4B are scanning electron micrographs of surface changes of the aluminum (Al) circuit in a sample using the stripper composition prepared according to Comparative Example 1 of the present invention.

FIG. 5 is an LC chromatogram of the stripper composition prepared according to Example 7 according to the present invention.

FIG. 6 is an LC chromatogram of the stripper composition prepared according to Comparative Example 6 of the present invention.

BEST MODES OF THE INVENTION

Hereinafter, the present invention will be described in detail with reference to preferred embodiments. However, the scope of the present invention is not limited thereto. In addition, even if the composition is essential for carrying out the present invention, detailed description of the matters that are disclosed in the related art or that can be easily implemented by those skilled in the art from the known technology will be omitted.

The eco-friendly photoresist stripper composition according to the present invention is used to dissolve and remove unnecessary photoresist in the lithography process and includes a glycol ether, a cyclic alcohol, an inhibitor, an alkanolamine, a reducing sulfur compound, and the balance as water based on 100 wt % of the total amount of all components.

The glycol ether is an ethylene oxide condensate and serves to dissolve a photoresist composed of a polymer material by permeating into the photoresist, and the content thereof is preferably 20 to 50 wt % based on the total weight of the stripper composition.

When the glycol ether content is less than 20 wt %, the photoresist permeability and dissolubility decrease, and the stripping rate is reduced. On the other hand, when the glycol ether content exceeds 50 wt %, the photoresist dissolubility increases, but alkalinity decreases as the water content decreases, thereby reducing hydrolysis by the alkanolamine, which will be described later.

As the glycol ether, any one or more selected from diethylene glycol monomethyl ether, diethylene glycol monoethyl ether, diethylene glycol monopropyl ether, diethylene glycol monobutyl ether, and diethylene glycol mono t-butyl ether may be used. As the glycol ether, diethylene glycol monomethyl ether is most preferred.

The cyclic alcohol serves to promote photoresist stripping by permeating into the photoresist, and the content thereof is preferably 1 to 10 wt %. When the cyclic alcohol content is less than 1 wt %, permeability decreases and the stripping rate is reduced. On the other hand, when the cyclic alcohol content exceeds 10 wt %, the polarity of the solution decreases, causing layer separation in the stripper composition.

As the cyclic alcohol, any one or more selected from benzyl alcohol, p-cumyl phenol, cyclohexanol, and cyclopentanol may be used, and among them, benzyl alcohol is most preferred.

The inhibitor serves to prevent corrosion of metal circuits composed of aluminum (Al) and copper (Cu), and the content thereof is preferably 1 to 10 wt %. The inhibitor may be composed of a first inhibitor preventing corrosion of aluminum and a second inhibitor preventing corrosion of copper, and their composition ratio is preferably 0.1 to 10 parts by weight of the second inhibitor relative to 100 parts by weight of the first inhibitor.

When the first inhibitor content is lower than the above content, there is a risk that corrosion of the aluminum circuit may occur as adsorption to aluminum decreases. On the other hand, when the first inhibitor content is higher than the above content, the amount of alkoxide produced from the alkanolamine increases, which will be described later, and as a result, the ability to strip the photoresist decreases.

When the second inhibitor content is lower than the above content, there is a risk that corrosion of the copper circuit may occur as adsorption to copper decreases. On the other hand, when the second inhibitor content is higher than the above content, since adsorption to copper increases, the second inhibitor may remain on the surface of the copper circuit even after rinsing with ultrapure water, which may cause defects in semiconductor manufacturing in subsequent processes.

The first inhibitor is a polyhydric alcohol and for example, any one or more selected from glycerin, sorbitol, and xylitol may be used, and the second inhibitor is a nitrogen-containing heterocyclic compound and for example, any one or more selected from benzotriazole, 5-methyl benzotriazole, tolyl triazole, pyrazole, and 1,5-dimethyl pyrazole may be used. The most preferred first inhibitor is xylitol, and the most preferred second inhibitor is pyrazole.

The alkanolamine serves to hydrolyze the polymer material constituting the photoresist, and the content thereof is preferably 0.5 to 10 wt %. When the alkanolamine content is less than 0.5 wt %, stripping performance decreases due to reduced hydrolysis of the photoresist, and when the alkanolamine content exceeds 10 wt %, stripping ability increases as alkalinity increases, but the metal circuit surface corrodes.

As the alkanolamine, any one or more selected from monoethanolamine, diethanolamine, triethanolamine, monoisopropyl alcoholamine, diisopropyl alcoholamine, and aminoethoxy ethanol may be used, and monoisopropyl alcoholamine is most preferred.

The reducing sulfur compound serves to remove formaldehyde by reacting with formaldehyde and promote photoresist stripping, and the content thereof is preferably 0.01 to 10 wt %. The reducing sulfur compound is one of the characteristic components of the present invention and reacts with formaldehyde present in the stripper composition to produce hydroxy alkyl sulfonate.

When the content of the reducing sulfur compound is less than 0.01 wt %, the amount of the reducing sulfur compound reacting with formaldehyde is too small, and thus formaldehyde may not be sufficiently removed. On the other hand, when the content thereof exceeds 10 wt %, the efficiency of removing formaldehyde increases, but an increase in sulfur (S) content may cause corrosion of the surface of the metal circuit.

As the reducing sulfur compound, any one or more selected from lithium bisulfate, sodium bisulfate, potassium bisulfate, ammonium bisulfate, lithium bisulfite, sodium bisulfite, potassium bisulfite, ammonium bisulfite, sulfurous acid, lithium sulfite, sodium sulfite, potassium sulfite, ammonium sulfite, and sulfamic acid may be used, and among them, sulfamic acid is most preferred.

Among the above reducing compounds, each process of sodium bisulfite ($NaHSO_3$) and sodium sulfite ($Na_2SO_3$) reacting with formaldehyde ($CH_2O$) to irreversibly produce hydroxyl alkyl sulfonate is shown in the following reaction schemes.

$NaHSO_3+CH_2O \rightarrow HOCH_2SO_3Na$ $Na_2SO_3+CH_2O \rightarrow HOCH_2SO_3Na+NaOH$

EXAMPLES

As the examples of the present invention, stripper compositions composed of the components and contents, shown in Table 1 below, and the balance as water were prepared.

TABLE 1

| Example | Component and content (wt %) | | | | | |
|---|---|---|---|---|---|---|
| | Glycol ether | Cyclic alcohol | First inhibitor | Second inhibitor | Alkanolamine | Sulfur compounds |
| 1 | EDG 30 | BZOH 4 | Sorbitol 3 | MBTA 0.05 | MEA 1 | AS 0.01 |
| 2 | BDG 30 | CHOH 3 | Xylitol 5 | BTA 0.01 | MEA 3 | ABSfa 1 |
| 3 | t-BDG 25 | CPOH 3 | Glycerin 5 | MBTA 0.02 | DEA 3 | Sulfamic acid 1 |
| 4 | MDG 40 | BZOH 3 | Sorbitol 5 | MBTA 0.05 | DEA 4 | ABSfi 1 |
| 5 | PDG 30 | CHOH 4 | Sorbitol 3 | TTZ 0.01 | TEA 5 | AS 0.9 |
| 6 | EDG 40 | CPOH 3 | Glycerin 5 | TTZ 0.03 | TEA 6 | ABSfa 0.9 |
| 7 | BDG 30 | BZOH 4 | Xylitol 3 | PYZ 0.2 | MIPA 1 | Sulfamic acid 0.9 |
| 8 | EDG 40 | CHOH 4 | Xylitol 5 | MBTA 0.05 | MIPA 3 | ABSfi 0.9 |
| 9 | BDG 30 | CPOH 4 | Sorbitol 5 | MBTA 0.05 | DIPA 2 | AS 0.9 |
| 10 | EDG 40 | BZOH 3 | Xylitol 5 | TTZ 0.01 | DIPA 4 | ABSfa 0.7 |
| 11 | MDG 30 | CHOH 4 | Sorbitol 5 | BTA 0.01 | AEE 1 | Sulfamic acid 0.9 |
| 12 | EDG 30 | CPOH 4 | Glycerin 5 | PYZ 0.3 | AEE 3 | ABSfi 0.9 |

Comparative Examples

As the comparative examples of the present invention, stripper compositions composed of the components and contents, shown in Table 2 below, and the balance as water were prepared.

TABLE 2

| Comparative Example | Component and content (wt %) | | | | | |
|---|---|---|---|---|---|---|
| | Glycol ether | Cyclic alcohol | First inhibitor | Second inhibitor | Alkanolamine | Sulfur compounds |
| 1 | EDG 30 | BZOH 4 | — | MTBA 0.05 | MEA 1 | AS 0.1 |
| 2 | BDG 30 | CHOH 3 | Xylitol 5 | — | MEA 3 | ABSfa 1 |
| 3 | BDG 30 | BZOH 4 | Xylitol 3 | PYZ 0.2 | MIPA 15 | Sulfamic acid 0.9 |
| 4 | EDG 60 | CHOH 4 | Xylitol 5 | MTBA 0.05 | MIPA 3 | ABSfi 0.9 |
| 5 | PDG 30 | — | Sorbitol 3 | TTZ 0.01 | TEA 5 | AS 0.9 |
| 6 | BDG 30 | BZOH 4 | Sorbitol 5 | PYZ 0.2 | DIPA 4 | — |
| 7 | PDG 30 | — | Sorbitol 3 | TTZ 0.01 | TEA 5 | — |
| 8 | MDG 30 | CHOH 4 | Sorbitol 5 | BTA 0.01 | AEE 1 | Cysteine 1 |
| 9 | EDG 40 | BZOH 3 | Xylitol 5 | TTZ 0.01 | DIPA 4 | TGA 0.1 |

The description of the abbreviations of components used in Table 1 and Table 2 is as follows.

EDG: diethylene glycol monoethyl ether
BDG: diethylene glycol monobutyl ether
MDG: diethylene glycol monomethyl ether
PDG: diethylene glycol monopropyl ether
BZOH: benzyl alcohol-CHOH; cyclohexanol
CPOH: p-cumyl phenol-MBTA: 5-methyl benzotriazole
BTA: benzotriazole-TTZ: tolyl triazole
PYZ: pyrazole-MEA: monoethanolamine
DEA: diethanolamine-TEA: triethanolamine
MIPA: monoisopropyl alcoholamine-DIPA: diisopropyl alcoholamine
AEE: aminoethoxyethanol
AS: ammonium sulfite
ABSfi: ammonium bisulfite
ABSfa: ammonium bisulfate
TGA: thioglycolic acid For reference, Comparative Example 1 is a stripper composition that did not include the first inhibitor preventing corrosion of the aluminum circuit, and Comparative Example 2 is a stripper composition that did not include the second inhibitor preventing corrosion of the copper circuit.

Comparative Example 3 and Comparative Example 4 contained excessive amounts of alkanolamine (MIPA) and glycol ether (EDG), respectively, exceeding the content ranges according to the present invention.

Comparative Example 5 and Comparative Example 6 did not include the cyclic alcohol and the reducing sulfur compound according to the present invention, respectively, and Comparative Example 7 did not include either the cyclic alcohol or the reducing sulfur compound. Comparative Example 8 and Comparative Example 9 used sulfur compounds that were not specified in the present invention, that is, cysteine and thioglycolic acid, respectively, as the reducing sulfur compound.

[Performance Test]

1) Photoresist Removal Ability Test

After preparing samples on which the photoresist was applied to a thickness of 25 μm, each sample was immersed in the stripper compositions prepared according to Examples 1 to 12 and Comparative Examples 1 to 9 of the present invention at 40° C. and swung once per second.

The time required to remove all of the photoresist was measured while visually observing the samples and classified into the following three categories according to the time required (sec).

○: within 110 sec, Δ: 110 to 130 sec, x: more than 130 sec

2) Measurement of Damage to Metal Circuits

The surfaces of the copper (Cu) and aluminum (Al) circuits formed on the samples were analyzed using X-ray fluorescence spectrometry (XRF) and a scanning electron microscopy (FE-SEM). After the samples were immersed in each stripper composition at 40° C., the change in thickness of the copper and aluminum circuits was measured 10 minutes later, and the results were classified into the following three categories according to the degree to which the thickness (Å) of each circuit decreased.

○: within 10 Å, Δ: 10 to 50 Å, x: more than 50 Å

3) Measurement of Formaldehyde Content

For the stripper compositions prepared according to Examples 1 to 12 and Comparative Examples 1 to 9, liquid chromatography (LC) analysis according to EPA Method 8315 was performed to measure the formaldehyde content.

4) Test Results

The test results for items 1) to 3) above are shown in Table 3 and Table 4.

TABLE 3

| Example | Photoresist removal ability | Al circuit damage | Cu circuit damage | Formaldehyde content |
|---|---|---|---|---|
| 1 | ○ | ○ | ○ | Not Detected |
| 2 | ○ | ○ | ○ | Not Detected |
| 3 | ○ | ○ | ○ | Not Detected |
| 4 | ○ | ○ | ○ | Not Detected |
| 5 | ○ | ○ | ○ | Not Detected |
| 6 | ○ | ○ | ○ | Not Detected |
| 7 | ○ | ○ | ○ | Not Detected |
| 8 | ○ | ○ | ○ | Not Detected |
| 9 | ○ | ○ | ○ | Not Detected |
| 10 | ○ | ○ | ○ | Not Detected |
| 11 | ○ | ○ | ○ | Not Detected |
| 12 | ○ | ○ | ○ | Not Detected |

TABLE 4

| Comparative Example | Photoresist removal ability | Al circuit damage | Cu circuit damage | Formaldehyde content |
|---|---|---|---|---|
| 1 | ○ | x | ○ | Not Detected |
| 2 | ○ | ○ | x | Not Detected |
| 3 | ○ | Δ | Δ | Not Detected |
| 4 | Δ | ○ | ○ | Not Detected |
| 5 | Δ | ○ | ○ | Not Detected |
| 6 | ○ | ○ | ○ | 14 ppm |
| 7 | Δ | ○ | ○ | 9 ppm |
| 8 | ○ | ○ | ○ | 10 ppm |
| 9 | ○ | ○ | ○ | 9 ppm |

[Evaluation]

As shown in Table 3, it was confirmed that the stripper compositions prepared according to Examples 1 to 12 of the present invention had excellent photoresist removal ability, hardly caused damage to copper and aluminum circuits, and did not contain toxic formaldehyde. Overall, the stripper composition of Example 7 was the most cost-effective stripper composition.

On the other hand, as shown in Table 4, the stripper compositions prepared according to Comparative Examples 1 to 9 had insufficient photoresist removal ability or caused damage to the metal circuits compared to Examples.

Among the measurement results of "Measurement of damage to metal circuits," the attached FIGS. 1 and 2 are scanning electron microscopy (FE-SEM) images (30,000 times magnification) comparing the surface change of copper (Cu) circuits in the samples using the stripper compositions of Example 7 and Comparative Example 2, and the attached FIGS. 3 and 4 are scanning electron microscopy (FE-SEM) images (20,000 times magnification) comparing the surface change of aluminum (Al) circuits in the samples using the stripper compositions of Example 7 and Comparative Example 1.

In FIGS. 1 to 4, FIGS. 1A, 2A, 3A, and 4A are micrographs before using each stripper composition, and FIGS. 1B, 2B, 3B, and 4B are micrographs after using each stripper composition. From FIGS. 1 to 4, it can be seen that the stripper composition of Example 7 hardly caused damage to the surface of copper and aluminum circuits, but the stripper compositions of Comparative Example 1 and Comparative Example 2 caused severe damage to the surface of copper and aluminum circuits, respectively.

In Comparative Examples 6 and 7, which did not use a reducing sulfur compound, and Comparative Examples 8 and 9, which used a sulfur compound that was not specified in the present invention, a significant amount of formaldehyde was detected in the stripper compositions.

The attached FIG. 5 is an LC chromatogram for identifying formaldehyde in the stripper composition according to Example 7 of the present invention, and FIG. 6 is an LC chromatogram for identifying formaldehyde in the stripper composition according to Comparative Example 6 of the present invention. As shown in FIGS. 5 and 6, a clear formaldehyde peak was observed at 5.23 min in Comparative Example 6, whereas no peak was observed at the corresponding position in Example 7.

The invention claimed is:

1. An eco-friendly photoresist stripper composition comprising:
- 20 to 50 wt % of a glycol ether;
- 1 to 10 wt % of a cyclic alcohol having one hydroxyl group;
- 1 to 10 wt % of an inhibitor preventing corrosion of aluminum and copper;
- 0.5 to 10 wt % of an alkanolamine;
- 0.01 to 10 wt % of a reducing sulfur compound; and
- the balance as water, wherein the inhibitor is composed of 100 parts by weight of a polyhydric alcohol as a first inhibitor preventing corrosion of aluminum, and 0.1 to 10 parts by weight of a nitrogen-containing heterocyclic compound as a second inhibitor preventing corrosion of copper.

2. The composition of claim 1, wherein the glycol ether is any one or more selected from diethylene glycol monomethyl ether, diethylene glycol monoethyl ether, diethylene glycol monopropyl ether, diethylene glycol monobutyl ether, and diethylene glycol mono t-butyl ether.

3. The composition of claim 1, wherein the cyclic alcohol is any one or more selected from benzyl alcohol, p-cumyl phenol, cyclohexanol, and cyclopentanol.

4. The composition of claim 1, wherein the first inhibitor is any one or more selected from glycerin, sorbitol, and xylitol, and the second inhibitor is any one or more selected from benzotriazole, 5-methylbenzotriazole, tolyl triazole, pyrazole, and 1,5-dimethyl pyrazole.

5. The composition of claim 1, wherein the alkanolamine is any one or more selected from monoethanolamine, diethanolamine, triethanolamine, monoisopropyl alcoholamine, diisopropyl alcoholamine, and aminoethoxy ethanol.

6. The composition of claim 1, wherein the reducing sulfur compound is any one or more selected from lithium bisulfate, sodium bisulfate, potassium bisulfate, ammonium bisulfate, lithium bisulfite, sodium bisulfite, potassium bisulfite, ammonium bisulfite, sulfurous acid, lithium sulfite, sodium sulfite, potassium sulfite, ammonium sulfite, and sulfamic acid.

7. An eco-friendly photoresist stripper composition comprising:

30 wt % of diethylene glycol monobutyl ether;
4 wt % of benzyl alcohol;
3 wt % of xylitol;
0.2 wt % of pyrazole;
1 wt % of monoisopropyl alcoholamine;
0.9 wt % of sulfamic acid; and
the balance as water.

* * * * *